(12) United States Patent
Yonezawa

(10) Patent No.: US 6,831,455 B2
(45) Date of Patent: Dec. 14, 2004

(54) MECHANISM FOR FIXING PROBE CARD

(75) Inventor: Toshihiro Yonezawa, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 10/695,792

(22) Filed: Oct. 30, 2003

(65) Prior Publication Data

US 2004/0090223 A1 May 13, 2004

(30) Foreign Application Priority Data

Nov. 1, 2002 (JP) ......................................... 2002-319253
Jun. 3, 2003 (JP) ......................................... 2003-158533

(51) Int. Cl.⁷ ............................................. G01R 31/02
(52) U.S. Cl. ..................... 324/158.1; 324/757; 324/758
(58) Field of Search ............................... 324/158.1, 754, 324/755, 757, 758, 761, 763, 764, 765; 438/14, 15

(56) References Cited

U.S. PATENT DOCUMENTS 5,521,523 A    5/1996  Kimura et al.
6,179,465 B1 *  1/2001  Yam ................................ 374/2
6,545,458 B2 *  4/2003  Yamazaki ................. 324/158.1

* cited by examiner

Primary Examiner—David Zarneke
Assistant Examiner—Trung Q. Nguyen
(74) Attorney, Agent, or Firm—Oblon, Spivak, McClelland, Maier & Neustadt, P.C.

(57) ABSTRACT

In a mechanism for fixing a probe card, the probe card and a support frame are joined to each other about the axis of each of the probe card and the support frame by a plurality of first fastening members. Also, the outer circumferential edge portion of the support frame is fixed by a plurality of second fastening members to a holder fixed to a probe unit. The probe card is held by the mechanism such that the central region of the probe card is restricted by the first fastening members and the outer circumferential portion of the probe card is not restricted so as to be rendered free. It follows that the probe card is expanded toward the outer circumferential edge portion by thermal expansion under a high-temperature. However, the probe card is prevented from being deformed in the shape of a dome.

7 Claims, 4 Drawing Sheets

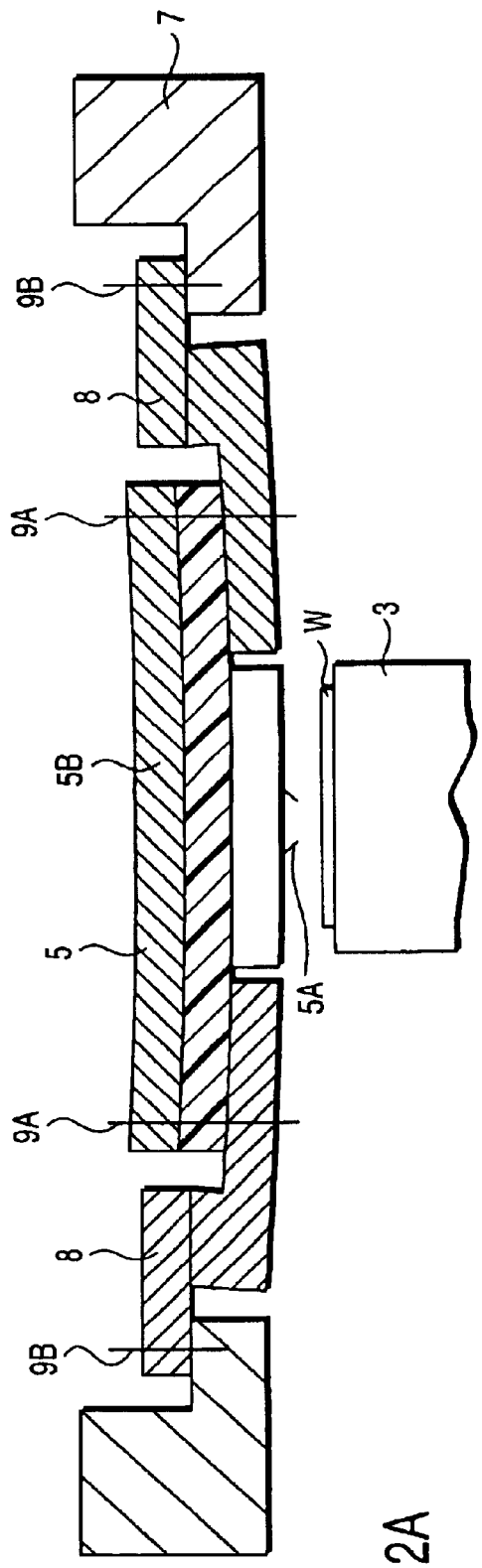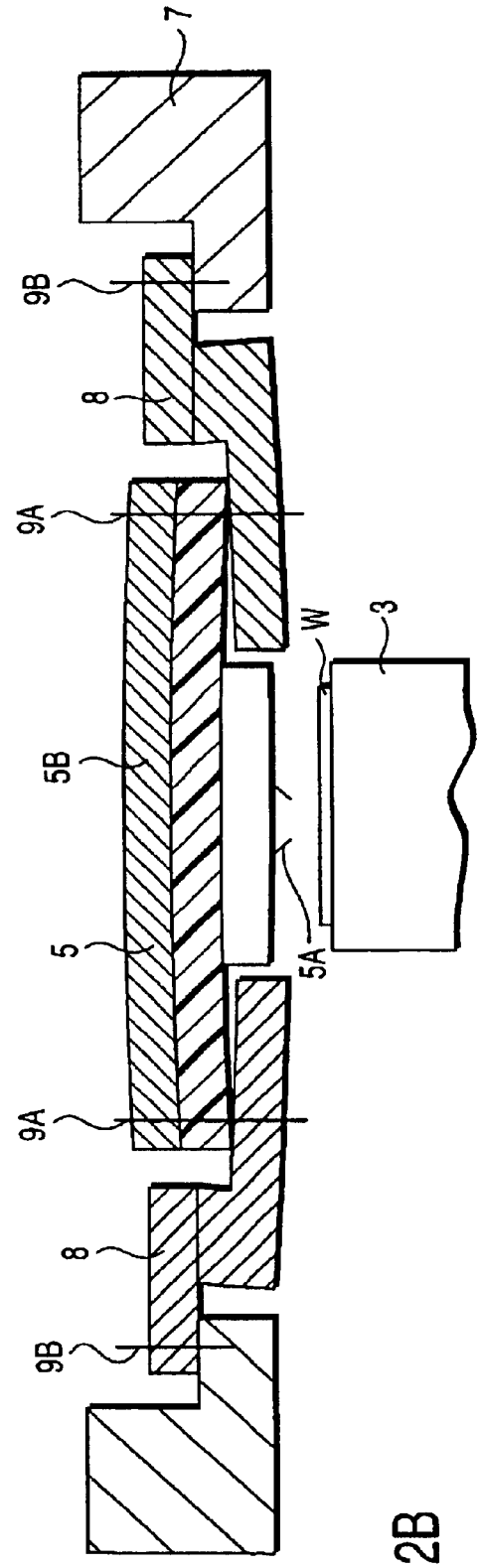
FIG. 2A
FIG. 2B

MECHANISM FOR FIXING PROBE CARD

CROSS-REFERENCE TO RELATED APPLICATIONS

This application is based upon and claims the benefit of priority from the prior Japanese Patent Applications No. 2002-319253, filed Nov. 1, 2002; and No. 2003-158533, filed Jun. 3, 2003, the entire contents of both of which are incorporated herein by reference.

BACKGROUND OF THE INVENTION

1. Field of the Invention

The present invention relates to a probe unit for examining the electrical characteristics of a target object, particularly, to a fixing mechanism of a probe card for fixing a probe card arranged within a body of a probe unit, i.e., a fixing mechanism of a probe card, which permits suppressing the thermal deformation of the probe card during examination under high-temperature.

2. Description of the Related Art

In the manufacturing process of a semiconductor device, used is an examining apparatus, e.g., a probe unit as shown in FIG. 1, which is called a prober, for examining the electrical characteristics of a plurality of devices formed on a wafer. The probe unit shown in FIG. 1 comprises a loader chamber 1 for receiving wafers W therein and equipped with a mechanism for transferring the wafers W, and a probe chamber 2 for examining the electrical characteristics of the wafer W transferred from the loader chamber 1. Each of the wafer W is pre-aligned in the transfer process of the wafer W in the loader chamber 1, and the electrical characteristic of the wafer W is examined in the probe chamber 2.

In the prober chamber 2, the pre-aligned wafer W is disposed on a main chuck 3 provided with a heating source for heating the wafer W and maintaining the wafer at a predetermined temperature. The main chuck 3 is arranged on an XY table 4 that permits the wafer W to be moved in the X-direction and the Y-direction, and wafer W is disposed on a prescribed position by driving the XY table 4.

A probe card 5 provided with a plurality of probe pins 5A is arranged above the main chuck 3, and the probe card 5 is supported by an aligning mechanism 6. The aligning mechanism 6 is operated so as to permit the probe pins 5A to be positioned accurately above a plurality of electrode pads of the wafer W held by the main chuck 3. Also, a lift mechanism is arranged inside the main chuck 3. During the examining process, the wafer W is moved upward by the lift mechanism so as to allow the probe pins 5A to be brought into a mechanical and electrical contact with the electrode pads. Also, after the examining process, the wafer W is moved downward by the lift mechanism so as to cause the probe pins 5A to be separated mechanically and electrically from the electrode pads.

Also, a test head T of a tester is rotatably arranged on a head plate 7 defining the probe chamber 2, as shown in FIG. 1. The test head T is electrically connected to the probe card 5 via a performance board (not shown). The temperature of the wafer W disposed on the main chuck 3 is set at a prescribed temperature falling with a prescribed temperature range, e.g., a temperature range of between −40° C. and +150° C., and the temperature of the wafer W is maintained at the set temperature during the test. Also, during the test, a signal for the examination is transmitted from the tester to reach the probe pins 5A via the test head T and the performance board noted above, with the result that the signal for the examination is applied from the probe pins 5A to the electrode pads of the wafer W so as to examine the electrical characteristics of a plurality of semiconductor devices formed on the wafer W. Where the wafer W is set at a high-temperature not lower than the room temperature, the wafer W is heated to the prescribed temperature via a temperature control mechanism including the heating source provided in the main chuck 3 and, then, the electrical characteristics of the wafer are examined.

The circuit of the chip formed on the wafer W has been rendered ultra fine in recent years and the diameter of the wafer W itself has been much enlarged in recent years. In accordance with these tendencies, the diameter of the probe card 5 has been also enlarged in recent years. In accordance with the enlargement of the diameter, the probe card 5 is reinforced by a support frame 5B made of a metallic material such as stainless steel as shown in FIGS. 2A and 2B so as to impart a sufficiently rigid structure to the probe card 5. The probe card 5 is fixed to the head plate 7 by an annular holder 8 together with the support frame 5B. To be more specific, the probe card 5 is fastened and fixed to the holder 8 together with the support frame 5B by a plurality of fastening members 9A such as a screw. Also, the holder 8 is fastened and fixed to the head plate 7 via a plurality of fastening members 9B.

In the mechanism for fixing the probe card described above, a problem is generated in the case of examining the electrical characteristics of the wafer W in the initial stage of the heating under a high-temperature environment, e.g., a high-temperature environment of 100° C. To be more specific, the lower side of the probe card 5 or the holder 8 is more heated than the upper side by the heat radiated from the main chuck 3. As a result, the lower side is thermally expanded more greatly than the upper side, with the result that the probe card 5 or the holder 8 is bent. What should also be noted is that the probe card 5 is fixed to the inner circumferential edge portion of the holder 8. As a result, the probe card 5 is prevented from being elongated radially outward and is elongated radially inward so as to be bent downward, as shown in FIG. 2A. It should also be noted that the outer circumferential edge portion of the holder 8 is fixed to the head plate 7. As a result, the holder 8 is elongated radially inward so as to cause the probe card 5 to be further bent downward. Such being the situation, the probe pins 5A are displaced vertically downward so as to cause the probe pressures between the probe pins 5A and the electrode pads of the wafer W to be set greater than the preset values. As a result, the electrode pads and the underlayers thereof are bruised so as to invite a defective examination. Particularly, where the probe card 5 is reinforced by the support frame 5B as shown in FIGS. 2A and 2B, a serious problem is generated that the probe card 5 is much affected by the thermal expansion of the support frame 5B.

It should also be noted that, in the examination stage under a high-temperature, the probe card 5 and the support frame 5B are sufficiently heated so as to be thermally expanded, as shown in FIG. 2B. Also, since the holder 8 is sufficiently heated so as to be thermally expanded, an outward stress is exerted from the probe card 5 and the support frame 5B to the fastening member 9A. At the same time, an inward stress is exerted from the holder 8 to the fastening member 9A. Where such a function is generated, the probe card 5 is bent upward as shown in FIG. 2B, which is opposite to that shown in FIG. 2A. In this case, the probe pins 5A are moved upward so as to bring about possibly a defective contact. The phenomenon shown in FIGS. 2A and 2B is similarly generated in the case where the probe card 5 is reinforced by the support frame 5B.

BRIEF SUMMARY OF THE INVENTION

An object of the present invention is to provide a mechanism for fixing the probe card, which permits suppressing the stress generated by the thermal deformation of the probe card so as to suppress the displacement of the probe pins in the up-down direction, thereby improving the reliability of the examination of the electrical characteristics of the wafer.

According to an aspect of the present invention, there is provided a fixing mechanism arranged within a probe unit for examining the electrical characteristics of a target object, the target object being maintained under a high-temperature environment within a probe chamber, comprising:

a probe card provided with a plurality of probes which are to be brought into an electrical and mechanical contact with the target object, which is configured to examine the electrical characteristics of the target object, the probe card being exposed to a high-temperature atmosphere;

a support frame configured to support the probe card in the central portion thereof;

a plurality of first fastening members configured to fasten the probe card on the support frame to fix the probe card;

a holding frame configured to hold the probe card and the support frame in the outer peripheral portions thereof so as to permit the probe card to be thermally expanded toward the periphery thereof, the holding frame being fixed to the probe unit; and a plurality of second fastening members configured to fasten the holding frame on the support frame to fix the holding frame.

Additional objects and advantages of the present invention will be set forth in the description which follows, and in part will be obvious from the description, or may be learned by practice of the present invention. The objects and advantages of the present invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the present invention, and together with the general description given above and the detailed description of the preferred embodiments given below, serve to explain the principles of the present invention.

FIGS. 2A and 2B are cross-sectional views schematically showing in a magnified fashion the state of the probe card shown in FIG. 1 in the examining stage under a high-temperature;

DETAILED DESCRIPTION OF THE INVENTION

Various embodiments of the present invention in respect of the mechanism for fixing the probe card will now be described with reference to the accompanying drawings.

Figure 1:
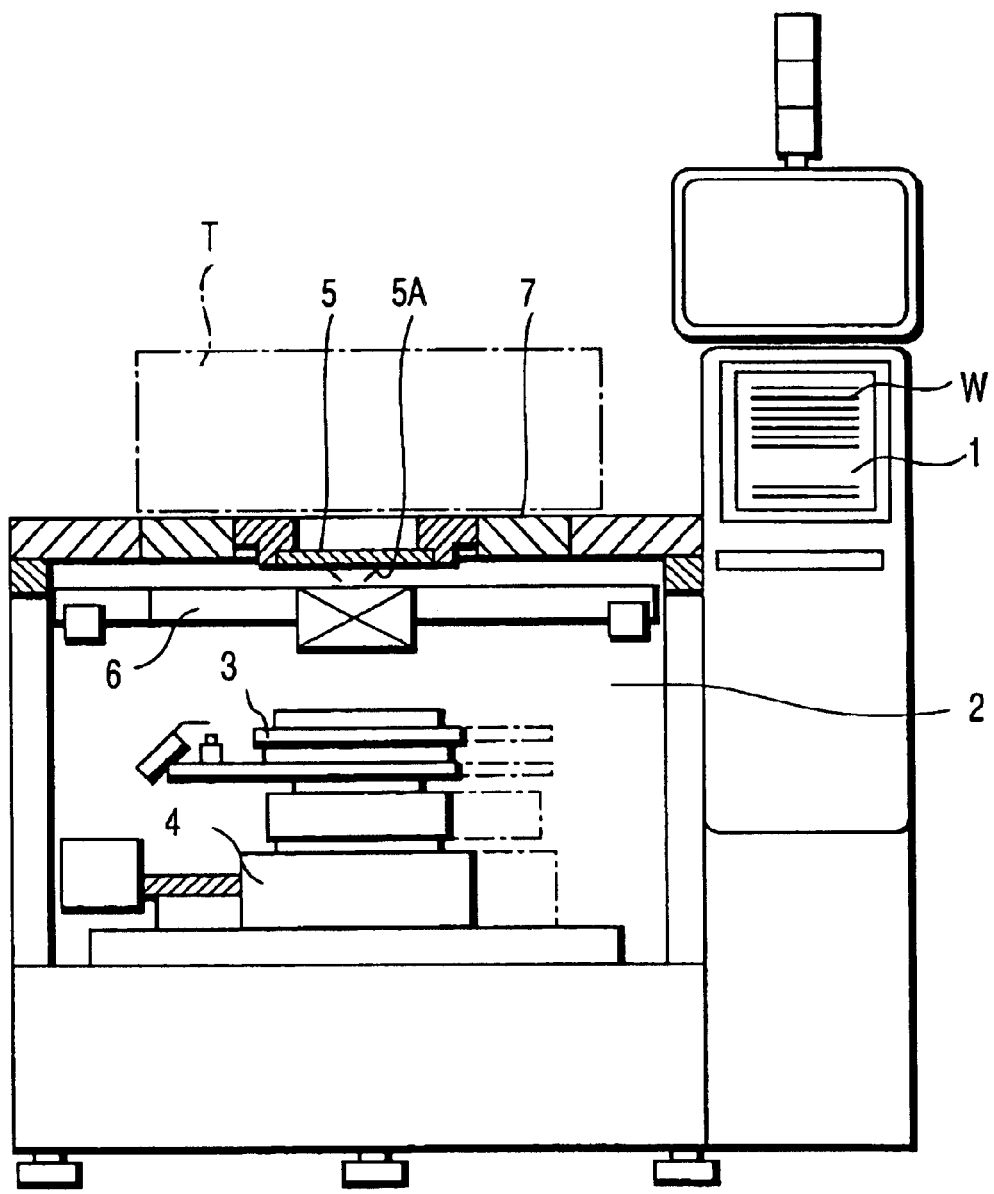
FIG. 1 is a front view, partly broken away, schematically showing the configuration of a probe unit provided with a conventional mechanism for fixing the probe card.
Figure 3:
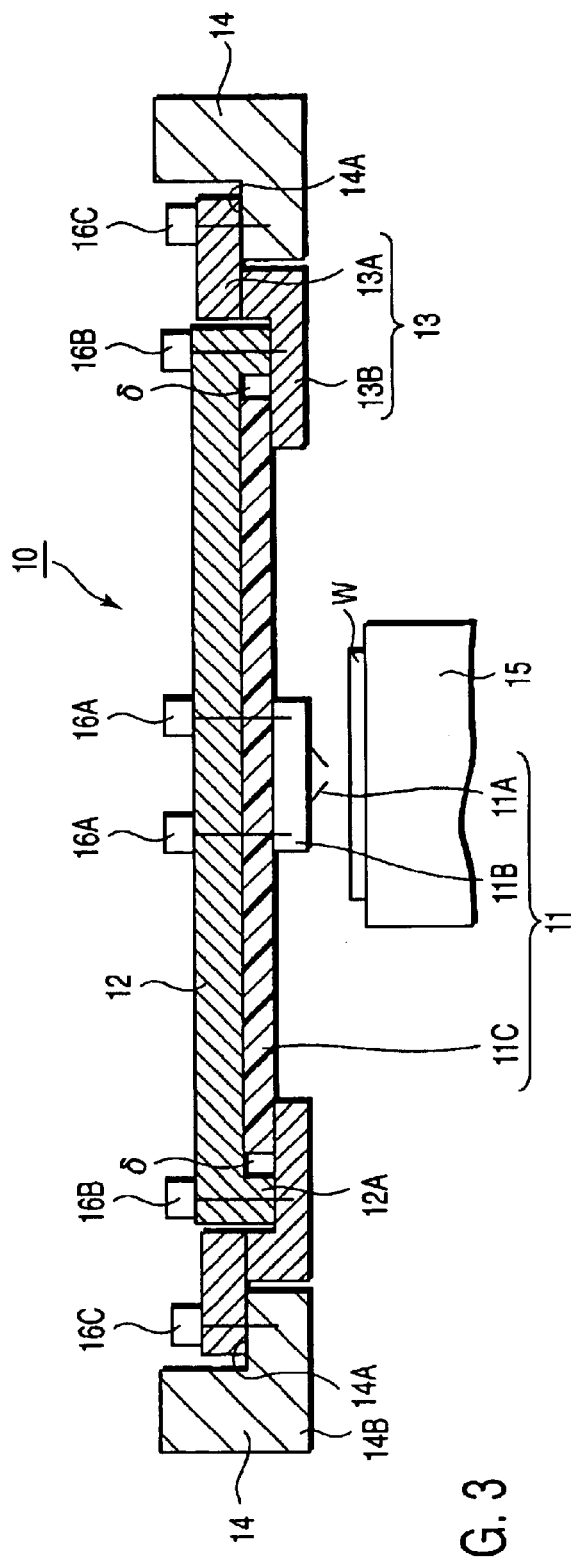
FIG. 3 is a cross-sectional view schematically showing the mechanism for fixing the probe card according to one embodiment of the present invention.

FIG. 3 schematically shows the configuration of a fixing mechanism 10 according to one embodiment of the present invention. As shown in FIG. 3, a disk-like probe card 11 is fixed to the fixing mechanism 10. The fixing mechanism 10 comprises a support frame 12 for supporting the probe card 11 from the upper surface and an annular holder 13 for holding the outer peripheral edge portions of the probe card 11 and the support frame 12. The fixing mechanism 10 is fixed to a head probe 14 arranged within a probe chamber having a configuration similar to the conventional configuration. As a result, the fixing mechanism 10 permits the probe card 11 to be fixed to and held by the head plate 14. The probe unit comprising the probe chamber has substantially the same structure as that of the conventional probe unit and, thus, the description thereof is omitted. For example, the fixing mechanism 10 of the probe card according to this embodiment of the present invention can be applied to the probe unit described previously in conjunction with the prior art with reference to FIG. 1 and, thus, attention should be paid to the description of the prior art. It should also be noted that the probe fixing mechanism of the present invention can be applied apparently to not only the probe unit shown in FIG. 1 but also the probe unit having the other known configuration.

A main chuck 15 is arranged within the prober chamber. The wafer W held stationary on the main chuck 15 can be transferred in the horizontal direction (X, Y-directions) by an XY table and the up-down direction (Z-direction) by an up-down mechanism (i.e. Z-transfer mechanism) provided in the main chuck 15.

The probe card 11 comprises a plurality of probe pins 11A, a contactor section 11B having the probe pins 11A mounted thereto, and a circuit substrate 11C having the contactor section 11B fixed to the central portion thereof. The contactor section 11B, the circuit substrate 11C and the support frame 12 are joined to each other via a plurality of first fastening members 16A formed of screws, etc., with the result that the probe card 11 and the support frame 12 are formed integral. To be more specific, the plural first fastening members 16A are arranged in symmetry with respect to the axis of the circuit substrate 11C so as to permit the probe card 11 to be fastened to the central region of the circuit substrate 11C with a uniform fastening force.

As described above, the fixing mechanism shown in FIG. 1 is constructed such that the probe card 11 is integrally joined to the central portions of the support frame 12 and the circuit substrate 11C. It follows that, in the fixing mechanism shown in FIG. 3, the elongation in the central portion of the circuit substrate 11C caused by the thermal expansion is much suppressed even if the circuit substrate 11C is thermally expanded by the heat released from the main chuck in the examining stage under a high-temperature. As a result, the upward or downward dome-like thermal deformation along the axis of the circuit substrate 11C is suppressed so as to prevent the probe pins 11A from being displaced upward or downward.

Figure 4:
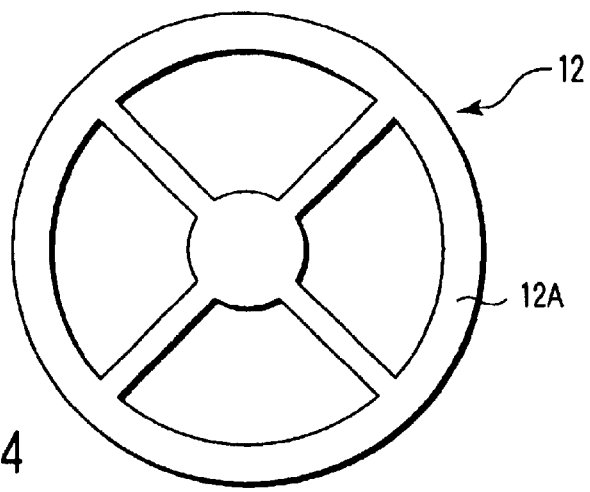
FIG. 4 is a plan view schematically exemplifying the configuration of the support frame shown in FIG. 1.

As shown in FIG. 3, the support frame 12 is in the form of a disk having a diameter larger than that of the circuit substrate 11C and is arranged such that the center of the support frame 12 substantially coincides with the center of the probe card 11. Alternatively, the support frame 12 is in the form of a wheel including an outer circumferential circular rim 12A and spokes extending from the circular rim to the hub in the central portion of the wheel, as shown in FIG. 4.

The outer circumferential rim 12A of the support frame 12 protrudes in an amount corresponding to the thickness of the circuit substrate 11C so as to permit the circuit substrate 11C to be held between the rim 12A and the holder 13, and the support frame 12 is formed such that the total thickness of the support frame 12 is substantially equal to the sum of the thickness in the inside portion of the support frame 12 and the thickness of the circuit substrate 11C. Also, the inner diameter of the rim 12A is made larger than the outer diameter of the circuit substrate 11C so as to have a clearance δ formed between the inside surface of the rim 12A and the outer circumferential surface of the circuit substrate 11C. Naturally, the difference between the inner diameter of the rim 12A and the outer diameter of the circuit substrate 11C corresponds to the clearance δ. It should be noted in this connection that, even if the circuit substrate 11C is thermally expanded from the center toward the outer circumferential surface, the thermal expansion of the circuit substrate 11C is absorbed within the clearance δ so as to prevent the outer edge of the circuit substrate 11C from abutting against the inside surface of the rim 12A. Also, the support frame 12 permits the probe card 11 to be fixed to the holder 13.

The holder 13 has an annular configuration such that the cross section thereof is L-shaped and comprises an annular outer peripheral edge portion 13A and a flange-like inner peripheral edge portion 13B stepped down from the outer circumferential edge portion 13A and formed within a plane differing from the plane on which the outer circumferential edge portion 13A is formed. The outer diameter of the holder 13 is made larger than the diameter of the central hole of the head plate 14, and the inner diameter of the holder 13 is made smaller than the outer diameter of the circuit substrate 11C included in the probe card 11.

The head plate 14 is formed on the prober chamber such that the main chuck 15 is capable of movement during the examination under a high-temperature within a range in which the main chuck 15 does not reach the region right under the head plate 14. Because of this particular configuration, the thermal effect given by the heat released from the main chuck 15 to the head plate 14 can be diminished as much as possible.

Also, the outer peripheral edge portion 12A of the support frame 12 is mounted on the inner peripheral edge portion 13B of the holder 13, and the outer peripheral edge portion 12A is fixed to the inner peripheral edge portion 13B by a plurality of second fastening members 16B. It follows that the outer peripheral edge portion of the circuit substrate 11C included in the probe card 11 is supported by the inner peripheral edge portion 13B of the holder 13 and the support frame 12. It should be noted, however, that the outer peripheral edge portion of the circuit substrate 11C is not restricted by, for example, the fastening members and is allowed to be elongated in the radial direction by the thermal expansion. Such being the situation, the circuit substrate 11C can be freely elongated or shrunk within the clearance δ even if the circuit substrate 11C is thermally expanded during the examination under a high-temperature. On the other hand, the holder 13 is fastened and fixed to a stepped edge portion 14A on the inner circumferential region of the head plate 14 by a plurality of third fastening members 16C which are equidistantly arranged in the circumferential direction of the outer peripheral edge portion 13A. The head plate 14 comprises an outer frame 14B having an L-shaped cross section and a stepped edge portion 14A extending inward from the outer frame 14B. The central hole defined by the stepped edge portion 14A is recessed relative to the outer frame 14B, and the central hole noted above is formed within the recess. It follows that the peripheral edge portion 14A of the central hole has a reference plane set in a lower portion relative to the outer frame of the head plate 14.

Incidentally, each of the second and third fastening members 16B and 16C is formed of, for example, a screw.

The circuit substrate 11C of the probe card 11 is formed as a multi-layered wiring structure by a known material such as a glass epoxy resin. Also, each of the support frame 12 and the holder 13 is formed of an inorganic material having a low thermal expansion coefficient such as a ceramic material like aluminum nitride or a metallic material having a low thermal expansion coefficient such as a nickel alloy like Invar. It is desirable for these materials to have a thermal expansion coefficient falling within a range of between zero and $3 \times 10^{-6}$, and more desirably to have a small thermal expansion coefficient not greater than $1 \times 10^{-6}$. Where the support frame 12 and the holder 13 are formed of these materials, it is possible to lower the thermal expansion generated in the support frame 12 and the holder 13 by the heat released from the main chuck 15 to $\frac{1}{10}$ of less of that generated in the conventional structure.

The examination of the electrical characteristics of the wafer W under a high-temperature by using the probe unit described above will now be described. If the wafer W is disposed on the main chuck 15 under the state that the main chuck 15 is heated to a prescribed temperature, e.g., to 150° C., the wafer W is heated to a prescribed temperature by the main chuck 15. Also, the wafer W is aligned with the probe pins 11A by the aligning mechanism including the main chuck 15 and the XY stage. Then, an index transfer of the wafer W in which the wafer W is transferred stepwise by a width corresponding to the chip formed on the wafer W is performed in accordance with movement of the main chuck 15. It follows that the electrode pad of the chip formed on the wafer W is aligned to face the probe pins 11A. If the electrode pad is aligned with the probe pins 11A, the wafer W is moved upward via the main chuck 15 so as to bring the electrode pad of the wafer W into contact with the probe pins 11A. Further, if the wafer W is overdriven within an allowable range in which damage is not done to the wafer W so as to bring the electrode pad of the wafer W into a sufficient contact with the probe pins 11A, the electrode pad is brought into an electrical contact with the probe pins 11A without fail.

If a signal for the examination is supplied from the tester to the probe card 11 under this state, the signal for the examination is applied from the probe pins 11A to the wafer W so as to start the examination of the electrical characteristics of the chip formed on the wafer W. The signal from the chip is supplied through the probe pins 11A to the tester side as a signal indicating the result of the examination. The signal supplied to the tester side is analyzed and stored in a memory device (not shown), thereby finishing the examination of a prescribed device under a high-temperature. Then, the main chuck 15 is moved downward so as to release the contact between the electrode pad and the probe pins 11A. Further, the index transfer of the wafer W and the vertical movement of the wafer W are repeated for examining the electrical characteristics of another chip so as to finish the examination of the wafer W under a high-temperature.

In performing the examination under a high-temperature, the temperature of each of the probe card 11, the support frame 12 and the holder 13 is elevated by the heat released from the main chuck 15. It should be noted that the probe card 11 is fixed in its central portion to the support frame 12 by the plural first fastening members 16A. As a result, the central portion of the probe card 11 fastened by the plural fastening members 16A, 16A is prevented from being displaced in the vertical direction. Also, the outer circumferential edge portion of the probe card 11 is not fixed and is rendered free. Therefore, even if the probe card 11 is thermally expanded toward the outer circumferential edge portion, it is possible to suppress the displacement of the probe pins 11A in the vertical direction. It should also be noted that the main chuck 15 is movable during the examination under a high-temperature within a range in which the main chuck 15 is not moved to reach a region right under the head plate 14. It follows that it is possible to suppress the thermal effect generated by the heat released from the main chuck 15 and given to the head plate 14. Further, each of the support frame 12 and the holder 13 is formed of a material having a low thermal expansion coefficient. Therefore, even if the temperature of each of the support frame 11 and the holder 13 is elevated by the heat released from the main chuck 15, it is possible to suppress the elongation of the support frame 11 and the holder 13 caused by the thermal expansion, leading to the capability of controlling satisfactorily the displacement of the probe pins 11A in the vertical direction.

As described above, according to this embodiment of the present invention, the probe card 11 and the support frame 12 are fastened to each other by a plurality of first fastening members 16A in the vicinity of the axis of each of the probe card 11 and the support frame 12. Also, the outer circumferential edge portion 12A of the support frame 12 is fastened and fixed to the holder 13 by a plurality of second fastening members 16B such that the outer circumferential edge portion of the probe card 11 is not fixed and is rendered free. It follows that it is possible to suppress satisfactorily the thermal deformation in the vertical direction of the probe card 11 and the displacement of the probe pins 11A in the vertical direction during the examination under a high-temperature. Such being the situation, it is possible to prevent the damage done to the electrode pad and to the underlying layer so as to make it possible to carry out the examination under a high-temperature satisfactorily.

Also, according to this embodiment of the present invention, the outer circumferential edge portion of the probe card 11 is positioned between the support frame 12 and the holder 13, and a clearance δ is formed on the outside of the outer circumferential edge surface of the probe card 11. It follows that the probe card 11, i.e., the circuit substrate 11C included in the probe card 11, is elongated by the thermal expansion within a range of the clearance δ and, thus, the stress does not act on the circuit substrate 11C so as to make it possible to suppress further the displacement of the probe card 11 in the vertical direction.

Figure 5:
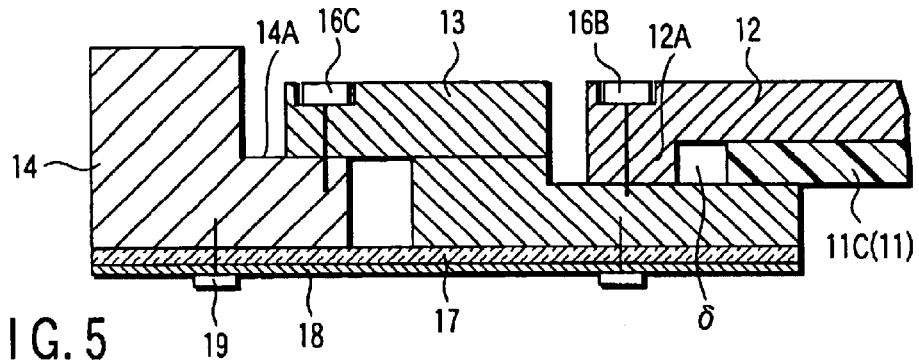
FIG. 5 is a cross-sectional view schematically showing the configuration of the mechanism for fixing the probe card according to another embodiment of the present invention.
Figure 6:
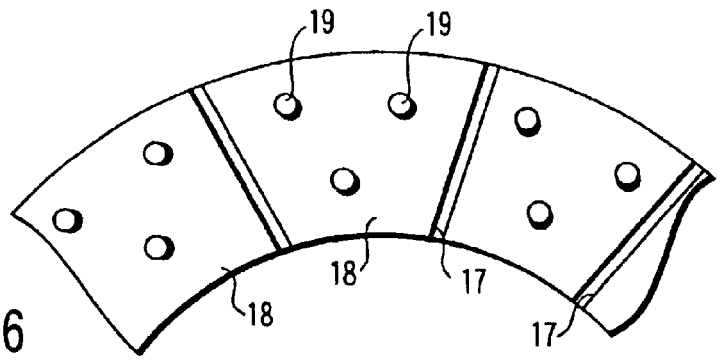
FIG. 6 is a plan view schematically showing the configuration the bottom surface of the mechanism shown in FIG. 5.

A mechanism for fixing the probe card according to another embodiment of the present invention will now be described with reference to FIGS. 5 and 6. Specifically, FIG. 5 is a partial cross-sectional view schematically showing the configuration of the mechanism for fixing the probe card according to another embodiment of the present invention, and FIG. 6 is a partial plan view schematically showing the configuration of the bottom surface of the mechanism shown in FIG. 5. Incidentally, those portions of the mechanism shown in FIGS. 5 and 6, which are equal to or which correspond to the portions of the mechanism shown in FIG. 3 are denoted by the reference numerals used in FIG. 3 so as to omit the overlapping description.

In the fixing mechanism 10 of the probe card shown in FIGS. 5 and 6, a heat-insulating sheet 17 is formed on the lower surfaces of the holder 13 and the head plate 14, as shown in FIG. 5. The mechanism shown in FIGS. 5 and 6 is substantially same configuration as that of the mechanism shown in FIG. 3, except that the heat-insulating sheet 17 is formed in the mechanism shown in FIGS. 5 and 6. The heat-insulating sheet 17 is covered with a heat resistant plate 18, and the plate 18 is fixed to the holder 13 and the head plate 14 by a fastening member 19 such as a screw. As shown in FIG. 6, the plate 18 is formed in a fan shape, and the fan-shaped plate 18 is arranged over the entire region of the holder 13 and the head plate 14. It is desirable for a clearance for absorbing the thermal expansion of the plate 18 to be formed between the adjacent sections of the plate 18. The material of the heat-insulating sheet 17 is not particularly limited, though it is desirable for the heat-insulating sheet 17 to be formed of a material that is unlikely to generate dust. To be more specific, it is desirable for the heat-insulating sheet 17 to be formed of, for example, a silicone sponge. It is possible to suppress the temperature elevation of the holder 13 and the head plate 14 by forming the heat-insulating sheet 17 on the lower surfaces of the holder 13 and the head plate 14, with the result that it is possible to further suppress the bending of the probe card 11 in the vertical direction.

It is also possible to form a heat-insulating sheet (not shown) on the lower surface of the probe card 11 or between the probe card 11 and the support frame 12 so as to suppress the temperature elevation of each of the probe card 11 and the support frame 12. By taking such a measure, it is possible to suppress the thermal expansion of the probe card 11 and the support frame 12, thereby further suppressing the bending of the probe card 11, i.e., the displacement of the probe pins 11A in the vertical direction, so as to realize the examination under a high-temperature with a further improved reliability.

Figure 7:
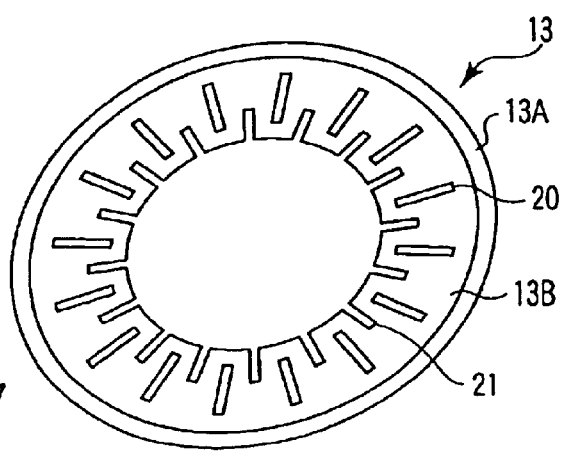
FIG. 7 is an oblique view showing the configuration of a modification of the probe card shown in FIG. 3.

It is possible for the card holder 13 that is shaped as shown in FIG. 7 to be incorporated in the mechanism shown in FIG. 3 or 5. To be more specific, FIG. 7 shows the outer shape of the probe card 13 directed toward the side of the probe chamber. As shown in FIG. 7, the card holder 13 comprises an annular outer circumferential edge portion 13A and a flange-like inner circumferential edge portion 13B stepped from the outer circumferential edge portion 13A toward the side of the probe chamber and extending toward the center of the card holder 13. A plurality of slits 20 are radially formed in the flange-like inner circumferential edge portion 13B. These slits 20 are formed substantially in symmetry with respect to the center of the holder 13. Also, recesses 21 are formed to extend from the inner edge of the inner circumferential edge portion 13B toward the outer circumferential edge portion 13A. The recesses 21 are radially arranged substantially in symmetry with respect to the center of the holder 13 like the slits 20 and extend to reach a region positioned between the adjacent slits 20. It follows that the slits 20 and the recesses 21 are alternately arranged in the inner circumferential region of the inner circumferential edge portion 13B.

In the apparatus in which the card holder 13 of the particular configuration is incorporated in the mechanism, the card holder 13 that is exposed to a high-temperature during the examination under a high-temperature receives heat radiation so as to be thermally expanded. However, the thermal expansion of the card holder 13 is absorbed by the slits 20 and the recesses 21, with the result that the card holder 13 itself is thermally expanded in the shape of a dome. It follows that it is possible to prevent the probe card 11 from being displaced in a manner to be pushed out toward or pulled into the probe chamber. Particularly, since the recesses 21 are formed to extend to reach a region between the adjacent slits 20, the card holder 13 is prevented from being deformed such that the inner circumferential region of the card holder 13 is corrugated even if the card holder 13 is thermally expanded.

Figure 8:
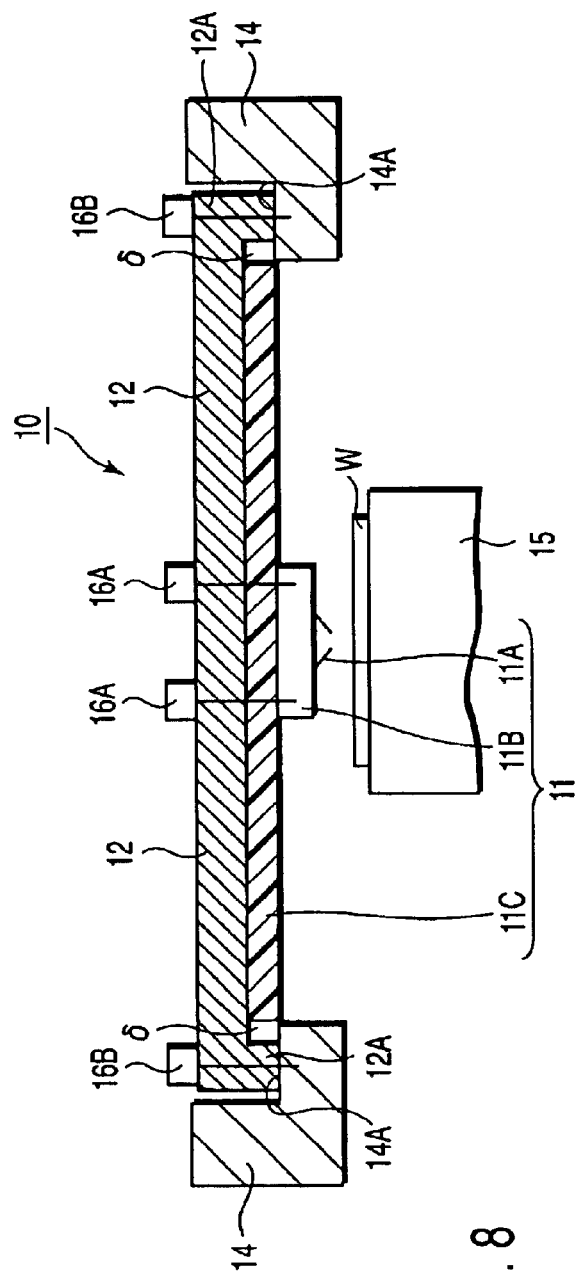
FIG. 8 is a cross-sectional view schematically showing the configuration of the mechanism for fixing the probe card according to still another embodiment of the present invention.

FIG. 8 is a cross-sectional view schematically showing the configuration of a mechanism 10 for fixing the probe card according to still another embodiment of the present invention.

The fixing mechanism 10 of the probe card shown in FIG. 8 has substantially the same configuration as that of the fixing mechanism shown in FIG. 3, except that the holder 13 shown in FIG. 3 is excluded from the fixing mechanism 10 shown in FIG. 8. To be more specific, in the fixing mechanism 10 shown in FIG. 8, the probe card 11 is joined to the support frame 12 by a plurality of first fastening members 16A arranged about the axis of the probe card 11 as in the fixing mechanism shown in FIG. 3. The outer circumferential edge of the probe card 11 is disposed on the inner circumferential edge portion 14A of the head plate 14. Also, the outer circumferential edge portion 12A of the support frame 12 is fastened and fixed to the circumferential edge portion 14A of the central hole of the head plate 14 by a plurality of second fastening members 16B, and a clearance 6 serving to absorb the thermal expansion of the circuit substrate 11C is formed between the outer circumferential surface of the circuit substrate 11C included in the probe card 11 and the inner circumferential surface of the outer circumferential edge portion 12A of the support frame 12. It follows that, according to the fixing mechanism shown in FIG. 8, it is possible to obtain the function and effect similar to those described previously in conjunction with the other embodiments of the present invention. In addition, since the holder is omitted in the embodiment shown in FIG. 8, it is possible to eliminate the influences given by the thermal expansion to the holder.

The present invention is not limited to each of the embodiments described above, and it is possible to modify the present invention in various fashions within the technical scope of the present invention. For example, in each of the embodiments described above, the probe card 11 is reinforced by the support frame 12. However, it is also possible to apply the technical idea of the present invention to the case where the fixing mechanism does not include the support frame 12. Also, in each of the embodiments described above, the support frame is shaped like a disk. However, it is also possible for the support frame to be shaped like a disk having an opening formed on the inside thereof like a wheel. Also, in each of the embodiments described above, the sum in thickness of the circuit substrate 11C included in the probe card 11 and the support frame 12 is substantially equal to the thickness of the outer circumferential edge portion 12A of the support frame 12. However, it is possible for the thickness of the outer circumferential edge portion 12A to be larger than the sum in thickness of the circuit substrate 11C and the inside portion of the support frame 12. Further, in each of the embodiments described above, the support frame 12 is positioned on the upper surface of the probe card 11. However, it is possible for the support frame 12 to be positioned on the lower surface, the upper surface, or both the lower and upper surfaces of the probe card 11.

Additional advantages and modifications will readily occur to those skilled in the art. Therefore, the present invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A fixing mechanism arranged within a probe unit for examining the electrical characteristics of a target object, the target object being maintained under a high-temperature environment within a probe chamber, comprising:

a probe card provided with a plurality of probes which are to be brought into an electrical and mechanical contact with the target object, which is configured to examine the electrical characteristics of the target object, the probe card being exposed to a high-temperature atmosphere;

a support frame configured to support the probe card in the central portion thereof;

a plurality of first fastening members configured to fasten the probe card on the support frame to fix the probe card;

a holding frame configured to hold the probe card and the support frame in the outer peripheral portions thereof so as to permit the probe card to be thermally expanded toward the periphery thereof, the holding frame being fixed to the probe unit; and a plurality of second fastening members configured to fasten the holding frame on the support frame to fix the holding frame.

2. A fixing mechanism according to claim 1, wherein the probe card is held between the holding frame and the support frame.

3. A fixing mechanism according to claim 1, wherein the outer circumferential edge portion of the probe card is positioned between the support frame and the holding frame, and a clearance is formed on the outside of the outer circumferential surface of the probe card.

4. A fixing mechanism according to claim 1, wherein each of the support frame and the holding frame is formed of a material having a low thermal expansion coefficient.

5. A fixing mechanism according to claim 1, wherein a heat-insulating material layer is formed on the lower surface of at least one of the support frame and the holding frame.

6. A fixing mechanism according to claim 1, further comprising a head plate having the holding frame fixed thereto.

7. A fixing mechanism according to claim 1, wherein the holding frame corresponds to the head plate.

* * * * *